United States Patent
Cornelius

(10) Patent No.: US 7,391,110 B2
(45) Date of Patent: Jun. 24, 2008

(54) APPARATUS FOR PROVIDING CAPACITIVE DECOUPLING BETWEEN ON-DIE POWER AND GROUND CONDUCTORS

(75) Inventor: William P. Cornelius, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 42 days.

(21) Appl. No.: 11/172,333

(22) Filed: Jun. 29, 2005

(65) Prior Publication Data

US 2005/0280137 A1    Dec. 22, 2005

Related U.S. Application Data

(63) Continuation-in-part of application No. 10/871,845, filed on Jun. 17, 2004, now Pat. No. 7,268,419.

(51) Int. Cl.
  *H01L 23/52*  (2006.01)
  *H01L 21/44*  (2006.01)
  *H01L 23/34*  (2006.01)

(52) U.S. Cl. .................. 257/724; 257/737; 257/734; 257/738; 257/778; 257/528; 257/532; 257/730; 257/924; 257/700; 257/691; 257/786; 257/698; 257/E23.021; 257/E23.062; 257/E23.079; 361/782; 361/783; 361/306.1

(58) Field of Classification Search ............... 257/724, 257/737, 738, 778, 528, 532, 730, 924, 700, 257/691, 786, 698, E21.511, E23.021, E23.062, 257/E23.079; 361/782, 783, 306.1
See application file for complete search history.

(56) References Cited

U.S. PATENT DOCUMENTS

| | | | |
|---|---|---|---|
| 6,418,029 B1 * | 7/2002 | McKee et al. ............... 361/760 |
| 6,703,705 B2 * | 3/2004 | Yamazaki et al. ........... 257/692 |
| 6,875,921 B1 * | 4/2005 | Conn ........................ 174/534 |
| 6,884,313 B2 * | 4/2005 | Liu et al. .................... 156/292 |
| 6,900,991 B2 * | 5/2005 | Patel et al. .................. 361/782 |
| 6,961,230 B2 * | 11/2005 | Otsuka et al. ............ 361/306.2 |
| 6,970,362 B1 * | 11/2005 | Chakravorty ................ 361/782 |
| 7,133,294 B2 * | 11/2006 | Patel et al. .................. 361/782 |
| 2003/0102555 A1 * | 6/2003 | Patel et al. .................. 257/723 |
| 2004/0135264 A1 * | 7/2004 | Yamazaki et al. ........... 257/778 |
| 2004/0264103 A1 * | 12/2004 | Otsuka et al. ............ 361/306.1 |
| 2005/0183290 A1 * | 8/2005 | Cantrell ...................... 36/116 |
| 2005/0247931 A1 * | 11/2005 | Seshan ....................... 257/48 |
| 2005/0280145 A1 * | 12/2005 | Cornelius ................... 257/723 |
| 2005/0280146 A1 * | 12/2005 | Cornelius ................... 257/730 |
| 2006/0012966 A1 * | 1/2006 | Chakravorty ................ 361/763 |
| 2006/0108607 A1 * | 5/2006 | Teshima et al. ............. 257/207 |

* cited by examiner

*Primary Examiner*—Alexander O Williams
(74) *Attorney, Agent, or Firm*—Park, Vaughan & Fleming LLP

(57) ABSTRACT

One embodiment of the present invention provides capacitive decoupling on the surface of a semiconductor die, instead of providing the decoupling on a package or printed circuit board to which the semiconductor die is attached. In this embodiment, a surface of a semiconductor die includes exposed power and ground conductors, which are electrically coupled to internal power and ground nodes within the semiconductor die. To provide the wafer-level decoupling, a plurality of bypass capacitors are electrically coupled between pairs of exposed power and ground conductors, so that the plurality of bypass capacitors reduce voltage noise between the power and ground conductors on the semiconductor die.

10 Claims, 2 Drawing Sheets

APPARATUS FOR PROVIDING CAPACITIVE DECOUPLING BETWEEN ON-DIE POWER AND GROUND CONDUCTORS

RELATED APPLICATION

This application is a continuation-in-part of a U.S. patent application Ser. No. 10/871,845, filed Jun. 17, 2004 now U.S. Pat. No. 7,268,419 entitled, "Interposer Containing Bypass Capacitors for Reducing Voltage Noise in an IC Device," by inventor William P. Cornelius. This application hereby claims priority under 35 U.S.C. §120 to the above-listed patent application. Moreover, the above-listed patent application is hereby incorporated by reference.

BACKGROUND

1. Field of the Invention

The present invention relates to techniques for reducing voltage noise in electrical circuits. More specifically, the present invention relates to a method and an apparatus for providing capacitive decoupling at the wafer level to reduce voltage noise on an integrated (IC) circuit device, such as a microprocessor chip.

2. Related Art

As microprocessors become progressively faster, voltage noise in the microprocessor core is becoming a significant factor in limiting system performance. Higher operating frequencies are causing circuitry within the microprocessor core to switch at faster rates. This faster switching can result in significant "step currents," which are caused for example by changing code patterns, sleep cycles, etc. Step currents can cause a significant voltage drop on the microprocessor die which is proportionate to L(di/dt), where L is the loop inductance from core power to core ground as seen from the microprocessor die, where di is the step current, and where dt is the time frame over which the step current occurs. If this voltage drop (or any other form of voltage noise) causes the voltage at the microprocessor core to drop below a minimum voltage, $V_{min}$, an error in the circuitry can potentially arise. Hence, the voltage drop at the microprocessor core caused by step currents can limit the maximum operating frequency, $F_{max}$, of the microprocessor.

Furthermore, as microprocessors have become faster, operating voltages within the microprocessor core have decreased. This lower operating voltage makes it possible for circuitry within the microprocessor core to switch more rapidly. However, it also makes the circuitry more sensitive to small amounts of voltage noise.

Voltage noise can be somewhat mitigated by using bypass capacitors to decouple to power and ground pins on the microprocessor die. For example, FIG. 1 illustrates how a microprocessor die 102 is integrated into a conventional microprocessor system. As is illustrated in FIG. 1, microprocessor die 102 is electrically coupled to a package 104 through a number of microbumps (or solder balls) on the backside of die 102. Package 104 is also electrically coupled to circuit board 106 through larger solder balls on the backside of package 104.

Note that electrical signals from die 102 flow through vias in package 104 to conductors within circuit board 106. In particular, power and ground lines from die 102 flow through package 104 into circuit board 106. In additional to connecting to power and ground planes within circuit board 106, these power and ground lines also flow through vias in circuit board 106 and attach to bypass capacitors 108 on the backside of circuit board 106.

Note that the larger current loops, which flow from die 102 through package 104 and through circuit board 106 to bypass capacitors 108, cause a significant voltage droop due to loop inductance, L, that can cause increased noise at higher operating frequencies (i.e. signals with low dt). Note that loop inductance is due to the physical structure's metallic conductor dimensions, which must support current flow. Although the current flow does not cause inductance directly, changes in the current flow provide the di in the relation ship $$V_{voltage\_droop}=L\,di/dt.$$

To reduce inductance, some systems increase the size of the capacitance within the die itself to increase the dt term to acceptable levels for overall voltage droop. They also provide low inductance loops to board-level, or module-level decoupling. Unfortunately, providing capacitance within the die involves using gate oxide capacitors, which have leakage modes. This is highly undesirable because semiconductor technology is at the point where leakage current dominates power dissipation.

Hence, what is needed is a method and an apparatus for lowering loop inductance for bypass capacitors without the above-described problems.

SUMMARY

One embodiment of the present invention provides capacitive decoupling on the surface of a semiconductor die, instead of providing the decoupling on a package or printed circuit board to which the semiconductor die is attached. In this embodiment, a surface of a semiconductor die includes exposed power and ground conductors, which are electrically coupled to internal power and ground nodes within the semiconductor die. To provide the wafer-level decoupling, a plurality of bypass capacitors are electrically coupled between pairs of exposed power and ground conductors, so that the plurality of bypass capacitors reduce voltage noise between the power and ground conductors on the semiconductor die.

In a variation on this embodiment, the exposed power and ground conductors are shaped as: bumps, balls, or columns.

In a variation on this embodiment, the plurality of bypass capacitors are mounted on the semiconductor die so that internal plates within the plurality of bypass capacitors extend vertically from the surface of the semiconductor die, thereby reducing inductance from moving vertical currents within the internal plates.

In a variation on this embodiment, the plurality of bypass capacitors are embedded within a build-up layer which is applied to the semiconductor die during a post-processing operation. Note that this buildup layer can be comprised of an organic material.

In a further variation, leads of the plurality of bypass capacitors serve as pins from the surface of the semiconductor die to a post-processed wafer-level package surface for power and ground connections.

In a variation on this embodiment, the surface of the semiconductor die also includes exposed signal conductors.

In a further variation, the exposed signal conductors extend to a height which is equal to or greater than a height of the plurality of bypass capacitors.

In a further variation, the exposed power and ground conductors are arranged into rows on the surface of the semiconductor die. Moreover, the exposed power and ground conductors alternate within each row, thereby allowing bypass capacitors to be placed between adjacent power and ground conductors within each row.

In a further variation, the exposed signal conductors are also arranged into rows. In this variation, rows of power and ground conductors are interspersed between rows of signal conductors.

In a variation on this embodiment, the semiconductor die is a "flip chip" semiconductor die.

DETAILED DESCRIPTION

Figure 1:
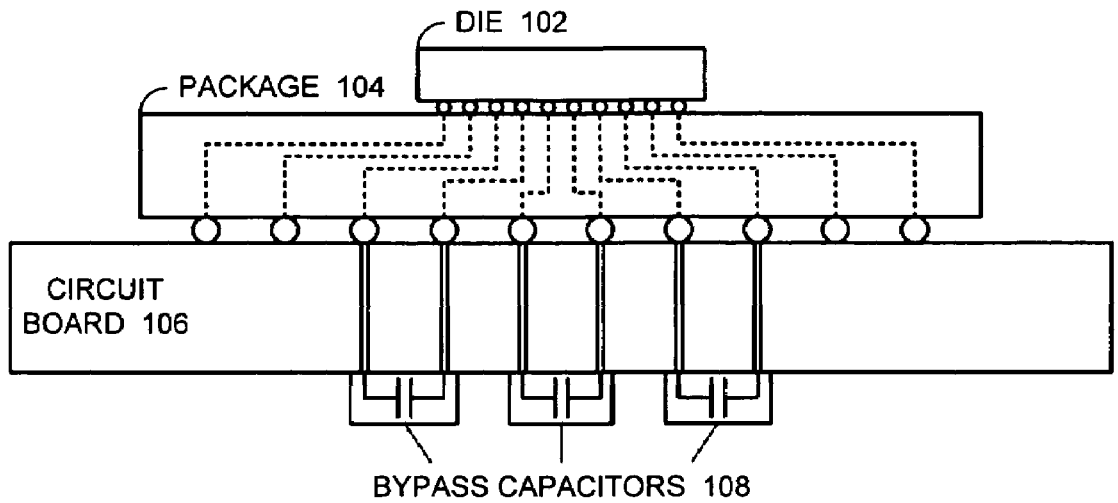
FIG. 1 illustrates how a semiconductor die and bypass capacitors are integrated into a conventional system.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Voltage Noise

Voltage noise is typically caused by current steps. Current steps cause a voltage variation which is given by the product of the current step and the source impedance of a devices power system. In general terms, $$V_{noise} = L\, d[I(t)]/dt + I(t)R,$$

where L is the equivalent inductance the die sees from the power system, R is the DC resistance from the die to the Voltage Mode Regulator (VMR) output node, and I(t) is the current as a function of time drawn by the device. With this expression we can see that if I(t) is increasing, and its derivative is increasing, while the operating voltage is decreasing, then a given percentage of the operating voltage (which would be our tolerable noise margin) is decreasing in absolute terms by the product of two terms. Thus, to prevent the noise margin from increasing, the inductance and perhaps the resistance need to be reduced by a square law function as we continue to move forward in semiconductor process generations.

Because loop area determines the inductance, in order to reduce the inductance (L) of a source impedance so that larger current transients give lower voltage noise, the loop area through which the transient flows needs to be reduced. One way to improve loop area is to have more loops in parallel; another is to have each loop be physically smaller.

Wafer-Level Capacitive Decoupling

With the advent of 01005 size capacitors (which are ~250μ×125μin size, with a capacitance of 0.22 μf) its now possible to have a capacitor that is approximately the same pitch as the distance between $V_{dd}$ to GND bump sites on a flip chip semiconductor die. If the bump pitch is selected to be approximately the same as the capacitor length, capacitors can be mounted with wafer-level processing to the die surface. The narrow width of the capacitors allows the I/O interconnects to be attached between the capacitors. The leads of the capacitor can serve as pins from the die surface to the post-processed wafer-level package surface for power and GND connections. Note that this placement of the capacitor on the die itself gives a very small loop area and a low inductance per capacitor, and it is possible to place one capacitor per $V_{dd}$-GND gap, (typically resulting in approximately two caps per $V_{dd}$-GND pair).

For example, on a 1000-pin device, this will provide about 400 capacitor sites. If the loop inductance per site is 100 pH, the net inductance for the overall design is 0.25 pH. This allows large step currents (of, for example, 100 amps, occurring in a 5 nanosecond time window) to be limited to causing a voltage drop of about 5 mV. This represents a loss of operating frequency of about 0.5%. Note that the maximum operating frequency is determined by the minimum voltage the system will operate at. Hence, during transient current changes, voltage dips on the voltage domain limit the maximum operating frequency. In contrast, using existing techniques the voltage droop is about 140 mV, which makes a >10% impact to maximum operating frequency.

Figure 2:
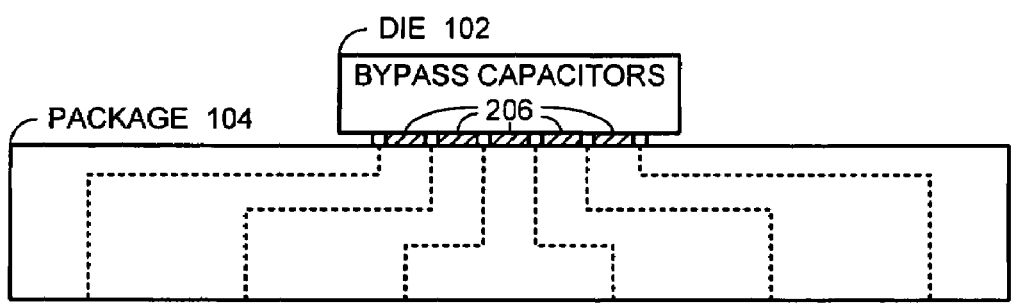
FIG. 2 illustrates how bypass capacitors are directly attached to a semiconductor die in accordance with an embodiment of the present invention.

More specifically, FIG. 2 illustrates how bypass capacitors can be directly attached to a semiconductor die in accordance with an embodiment of the present invention. In this embodiment, bypass capacitors 206 are directly attached to power and ground conductors (in the form of "bumps") on a surface semiconductor die 102. This allows bypass capacitors 206 fit into the space between semiconductor die 102 and package 104 as is illustrated in FIG. 2.

Figure 3A:
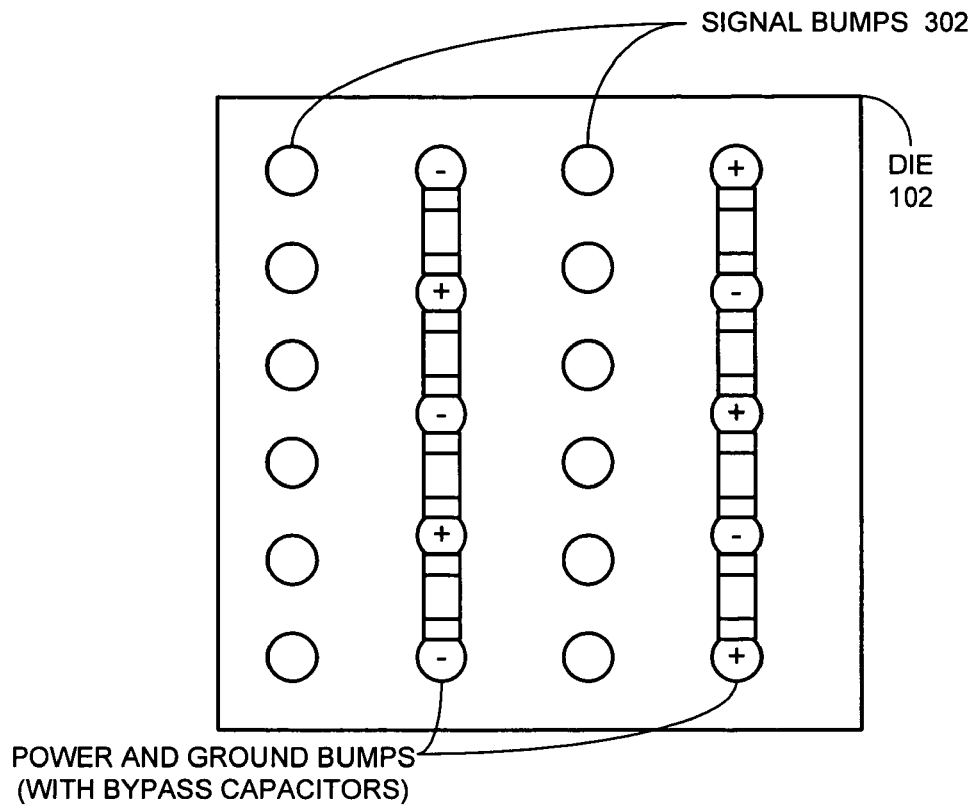
FIG. 3A illustrates how bypass capacitors are arranged on a semiconductor die in accordance with an embodiment of the present invention.

More specifically, FIG. 3A illustrates how bypass capacitors are arranged on semiconductor die 102 in accordance with an embodiment of the present invention. In FIG. 3A, semiconductor die 102 includes a number of signal bumps 302 and a number of power and grounds bumps 304. Note that power and ground bumps 304 alternate, which allows bypass capacitors to be located between adjacent power and ground bumps.

Furthermore, note that signal bumps 302 and power and ground bumps 304 do not have to be shaped as "bumps". In general, they can be any shape. For example, they can alternatively be shaped as columns or balls.

Furthermore, when bypass capacitors 206 are attached to semiconductor die 102, adjacent bypass capacitors can physically touch, or alternatively can be electrically coupled to each other through a conductor.

Figure 3B:
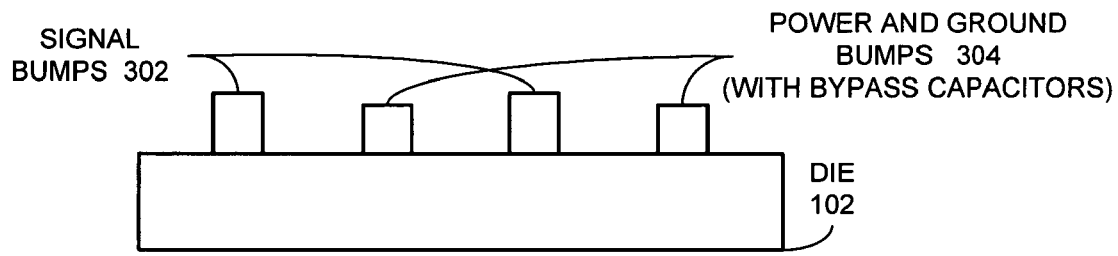
FIG. 3B presents a cross-sectional view of the semiconductor die in accordance with an embodiment of the present invention.

FIG. 3B presents a cross-sectional view of semiconductor die 102 in accordance with an embodiment of the present invention. In this view, signal bumps 302 are built up so that they extend to a height which is equal to or greater than a height of the power and ground bumps (and bypass capacitors) 304. This enables external signal lines to be easily attached to signal bumps 302.

Figure 3C:
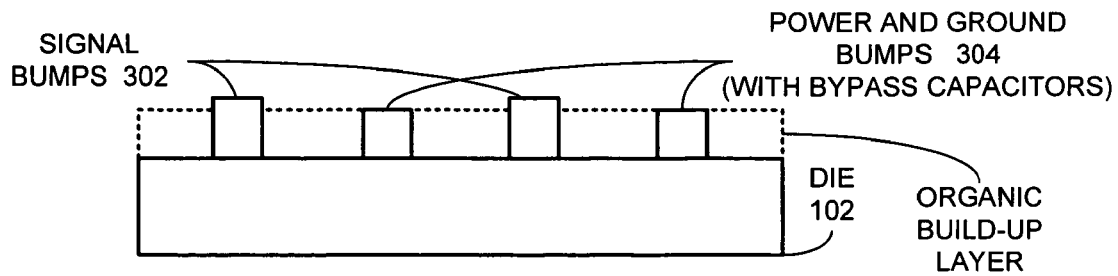
FIG. 3C presents a cross-sectional view of the semiconductor die including an organic build-up layer in accordance with an embodiment of the present invention.

In another embodiment of the present invention, a "build-up" layer (which can be made up of an organic material) is applied to the semiconductor die during a post-processing operation (see FIG. 3C). This build-up layer largely covers the solder bumps and bypass capacitors, so that the leads of the bypass capacitors serve as pins from the surface of the semiconductor die to a post-processed wafer-level package surface for power and ground connections. Note that this build-up layer can be made up of any material which has a relatively low dielectric constant. For example, in one embodiment of the present invention the build-up layer is comprised of an epoxy resin.

In variations of the design, the bypass capacitors can be oriented so that internal plates with the bypass capacitors are vertical relative to die surface. This reduces inductance of moving vertical currents within the bypass capacitors. In contrast, the current loop through plates which are oriented parallel to the die would have a longer lead path to each plate. Rotating the plates into a vertical orientation provides access to the edge of each plate and at the same time allows current to travel between the plates from one edge to the other with very low inductance.

Alternatively, regions with no I/O can use an array capacitor with leads on top and bottom with even lower L for a given $V_{dd}$-GND bump site loop inductance, because current can flow in all planar directions to all neighbor return bumps instead of only to one return bump. This can potentially lower the capacitor related inductance by a factor of up to 10x.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An apparatus that provides capacitive decoupling on a surface of a semiconductor die, comprising:
   the semiconductor die;
   wherein the surface of the semiconductor die includes exposed power and ground conductors, which are electrically coupled to internal power and ground nodes within the semiconductor die; and
   a plurality of bypass capacitors electrically coupled between pairs of exposed power and ground conductors, so that the plurality of bypass capacitors reduce voltage noise between the power and ground conductors of the semiconductor die, wherein a bypass capacitor comprises a set of internal plates;
   wherein the plurality of bypass capacitors are mounted on the semiconductor die so that internal plates within the plurality of bypass capacitors extend vertically from the surface of the semiconductor die, thereby reducing inductance from moving vertical currents within the internal plates.

2. The apparatus of claim 1, wherein the plurality of bypass capacitors are embedded within a build-up layer which is applied to the semiconductor die during a post-processing operation.

3. The apparatus of claim 2, wherein the build-up layer is comprised of an organic material.

4. The apparatus of claim 3, wherein leads of the plurality of bypass capacitors serve as pins from the surface of the semiconductor die to a post-processed wafer-level package surface for power and ground connections.

5. The apparatus of claim 1,
   wherein the exposed power and ground conductors are arranged into rows on the surface of the semiconductor die; and
   wherein the exposed power and ground conductors alternate within each row, thereby allowing bypass capacitors to be placed between adjacent power and ground conductors within each row.

6. The apparatus of claim 5,
   wherein the exposed signal conductors are also arranged into rows; and
   wherein rows of power and ground conductors are interspersed between rows of signal conductors.

7. The apparatus of claim 1, wherein the semiconductor die is a "flip chip" semiconductor die.

8. The apparatus of claim 1, wherein the exposed power and ground conductors are shaped as:
   bumps;
   balls; or
   columns.

9. The apparatus of claim 1, wherein the surface of the semiconductor die includes exposed signal conductors.

10. The apparatus of claim 9, wherein the exposed signal conductors extend to a height which is equal to or greater than a height of the plurality of bypass capacitors.

* * * * *